United States Patent
Dong

(10) Patent No.: US 7,125,769 B2
(45) Date of Patent: Oct. 24, 2006

(54) METHOD OF FABRICATING FLASH MEMORY DEVICE

(75) Inventor: Cha Deok Dong, Icheon-Si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/160,091

(22) Filed: Jun. 8, 2005

(65) Prior Publication Data

US 2006/0205150 A1    Sep. 14, 2006

(30) Foreign Application Priority Data

Mar. 10, 2005  (KR) ..................... 10-2005-0020218

(51) Int. Cl.
*H01L 21/336* (2006.01)
(52) U.S. Cl. ............... 438/257; 438/263; 438/E21.546; 438/424; 438/E21.55; 257/315; 257/E21.422; 257/E21.68; 257/E29.129

(58) Field of Classification Search ................ 438/257, 438/263, 424–426, 435
See application file for complete search history.

(56) References Cited

U.S. PATENT DOCUMENTS 6,613,646 B1 * 9/2003 Sahota et al. ................ 438/424

* cited by examiner

*Primary Examiner*—Quoc Hoang
(74) *Attorney, Agent, or Firm*—Marshall, Gerstein & Borun LLP

(57) ABSTRACT

A method of fabricating a flash memory devices disclosed wherein, upon formation of sidewall oxide films, a regrown thickness of a screen oxide film is controlled. The width of an element isolation film is reduced by means of an etch process for removing the re-growth oxide film. This allows a floating gate space to be easily secured, and a thickness of the sidewall oxide films is reduced by means of a liner nitride film pre-treatment cleaning process. It is thus possible to secure the trench space, which facilitates gap-filling.

22 Claims, 5 Drawing Sheets

METHOD OF FABRICATING FLASH MEMORY DEVICE

CROSS REFERENCE TO RELATED APPLICATIONS

This application relies for priority upon Korean Patent Application No. 2005-20218 filed on Mar. 10, 2005, the contents of which are herein incorporated by reference in their entirety.

FIELD OF THE INVENTION

The present patent relates to a method of fabricating a flash memory device, and more specifically, to a method of fabricating a flash memory device, wherein gap-fill characteristics of an element isolation film of a high integrated flash memory device can be improved.

DISCUSSION OF RELATED ART

As a flash memory device is highly integrated, lots of difficulties are encountered in constructing an element isolation film of the flash memory device. The most important problem is that the element isolation film is gap-filled into a trench having a narrow width and a deep depth, of a high aspect ratio.

As the flash memory device is highly integrated below 70 nm, an existing self-aligned shallow trench isolation (STI) method and gap-filling using a high density plasma (HDP) oxide film cannot be further adopted due to the lack of margin. It reaches a point where securing the space between floating gates becomes impossible through simple mask and etch work.

As an alternative method for solving this problem, a self-aligned floating gate (hereinafter, referred to as "SAFG") has been introduced. Even if the SAFG technology has been introduced, however, there inevitably occurs a trench burial problem.

SUMMARY OF THE INVENTION

Accordingly, the present patent addresses the above problems, and discloses a method of fabricating a flash memory device, wherein the floating gate space can be secured.

The patent also discloses a method of fabricating a flash memory device, wherein trench gap-fill characteristics can be improved.

To accomplish this, there is provided a method of fabricating a flash memory device, including the steps of forming a screen oxide film and a pad nitride film on a semiconductor substrate, etching the pad nitride film, the screen oxide film and the semiconductor substrate to form trenches, forming sidewall oxide films on the surface of the semiconductor substrate in which the trenches are formed, and regrowing the screen oxide film in such a way to have a predetermined thickness, reducing a thickness of the sidewall oxide films, forming a liner nitride film on the entire surface including the trenches, forming element isolation films within the trenches, removing the liner nitride film and the pad nitride film to expose the element isolation films that are projected upwardly from the semiconductor substrate, etching the entire surface so that the screen oxide film is removed, thereby reducing the width of the element isolation films, which are exposed due to the removal of the pad nitride film, and forming floating gates with tunnel dielectric films being intervened between neighboring element isolation films.

The screen oxide film is preferably formed to a thickness of 20 to 50 Å.

The method can further include the step of implanting a well ion and a threshold voltage ion after the screen oxide film is formed.

A thickness of the regrown screen oxide film is preferably 100 to 150 Å.

The sidewall oxide films are preferably formed to a thickness of 50 to 300 Å.

The liner nitride film is preferably formed to a thickness of 50 to 100 Å.

The element isolation films can be formed by performing the steps of forming an insulating film on the entire surface including the trenches so that the trenches are buried, performing an annealing process for removing a seam and void formed in the insulating film, and removing the insulating film by means of a CMP process so that the insulating film remains only within the trenches.

The insulating film is preferably formed using $O_3$ TEOS.

The $O_3$ TEOS film is preferably formed using $O_3$ and TEOS sources at a temperature of 500 to 550 Å and a pressure of 350 to 650 torr.

The annealing process is preferably an annealing process of wet oxidization mode.

The annealing process of the wet oxidization mode can be one of a steam anneal process and a wet oxidization process.

The annealing process of the wet oxidization mode can include the steps of performing a first annealing process under a mixed gas atmosphere of $H_2$ and $O_2$, and performing a second annealing process under an atmosphere including only $N_2$ gas.

In the first annealing process, the flow rate of $H_2:O_2$ is preferably 1:1 or 3:2.

A temperature of the first annealing process is preferably 700 to 1000 Å.

A temperature of the second annealing process is preferably 900 to 1000 Å.

The method can further include the step of performing a post cleaning process for removing an oxide film remaining on the pad nitride film, after the element isolation films is formed.

In the post cleaning process, BOE or HF can be used as a cleaning solution.

The liner nitride film and the pad nitride film can be etched using a phosphoric acid ($H_3PO_4$) solution.

When the screen oxide film is etched, DHF or BOE can be used as an etch solution.

The method can further include the step of removing the element isolation films existing between the floating gates by a predetermined thickness, thus exposing lateral portions of the floating gates after the floating gates are formed.

The element isolation films are preferably removed up to immediately on the tunnel dielectric film at a lower side of the floating gates.

After the floating gates are formed, the method can further include the steps of sequentially forming an interlayer dielectric film, a control gate and an anti-reflection coating film on the entire surface, and patterning the anti-reflection coating film, the control gate and the interlayer dielectric film by means of a gate patterning process, and patterning the floating gates by means of a self-aligned etch process using the patterned anti-reflection coating film.

DETAILED DESCRIPTION OF VARIOUS EMBODIMENTS

Various embodiments will be described with reference to the accompanying drawings. Those of ordinary skill in the art will appreciate that the disclosed embodiments may be modified in various manners and the scope of the present patent is not limited by the embodiments described later.

FIGS. 1a to 1i are cross-sectional views illustrating process steps in an exemplary method of fabricating a flash memory device.

Figure 1A:
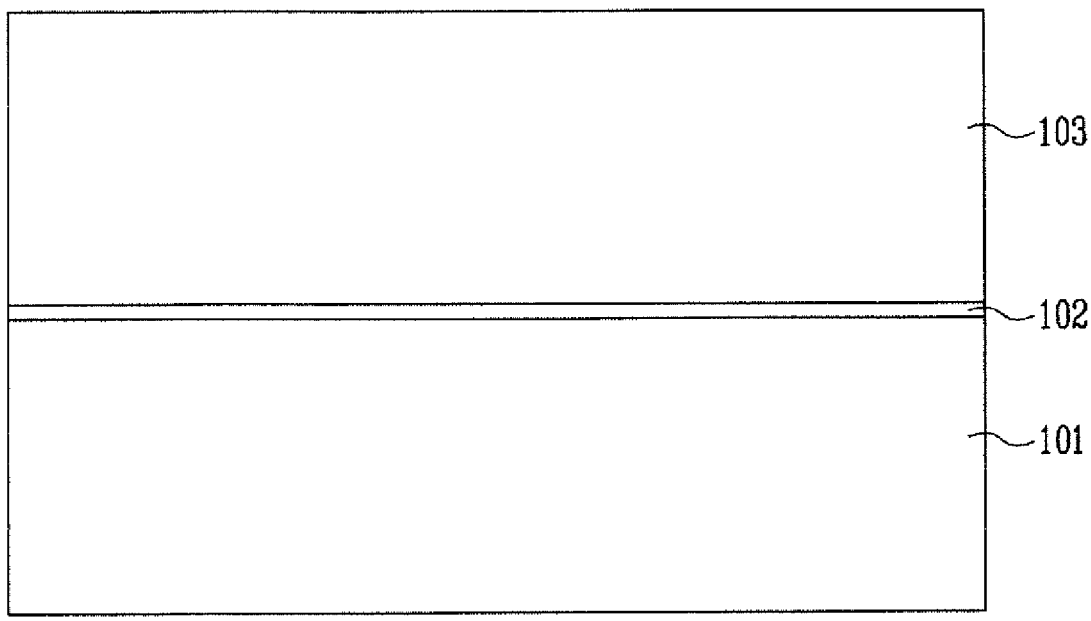
FIGS. 1a to 1i are cross-sectional views illustrating process steps in an exemplary method of fabricating a flash memory device.

Referring to FIG. 1a, a screen oxide film 102 is formed on a semiconductor substrate 101. After a well ion and various threshold voltage (Vt) ions are implanted, a pad nitride film 103 is deposited on a screen oxide film 102 in order to pattern an element isolation film.

In this case, the screen oxide film 102 is formed to a thickness of approximately 20 to 50 Å. The pad nitride film 103 is formed to a thickness sufficient enough to secure the height of a floating gate at the time of chemical mechanical polishing (hereinafter, referred to as "CMP") among a SAFG process to be performed later.

Figure 1B:
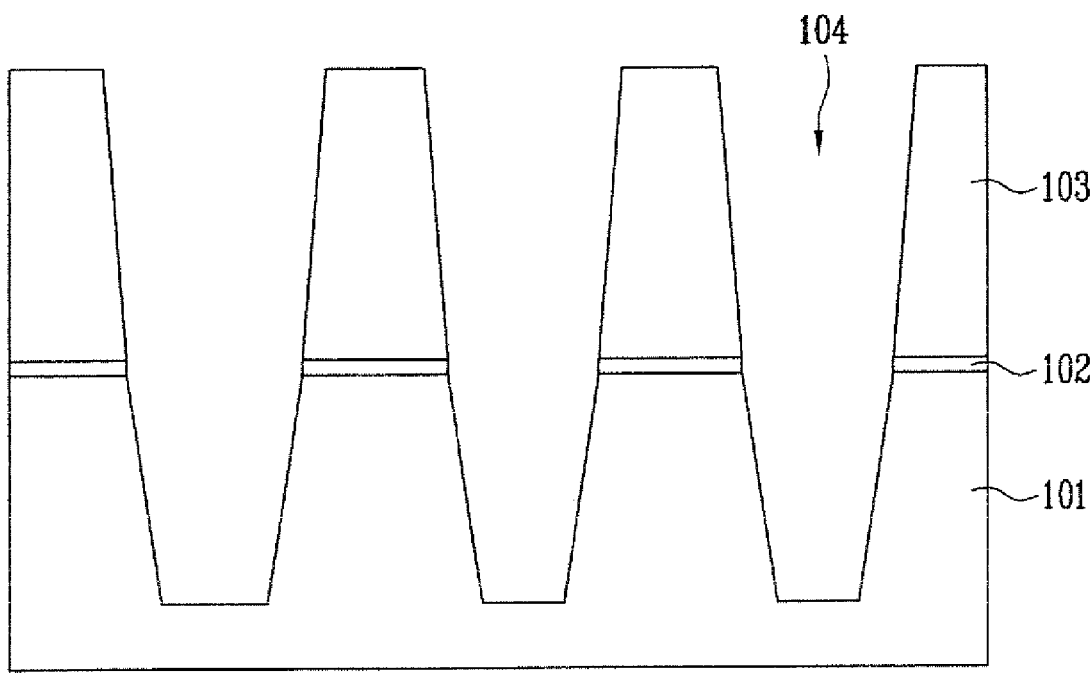

Referring next to FIG. 1b, the pad nitride film 103, the screen oxide film 102 and the semiconductor substrate 101 are selectively etched through patterning for forming an element isolation film, whereby trenches 104 are formed and an element isolation region and an active region are thus defined.

In particular, a photoresist pattern (not shown) that defines the element isolation region is formed. The pad nitride film 103, the screen oxide film 102 and the semiconductor substrate 101 are etched using the photoresist pattern as an etch mask, thus forming the trenches 104.

In this case, in order to facilitate patterning, a hard mask process can be used instead of the photoresist pattern. In other words, a hard mask film is formed on the pad nitride film 103. After the hard mask film is patterned by means of a predetermined photolithography process, the pad nitride film 103, the screen oxide film 102 and the semiconductor substrate 101 are etched using the patterned hard mask film as a mask, thereby forming the trenches 104.

Figure 1C:
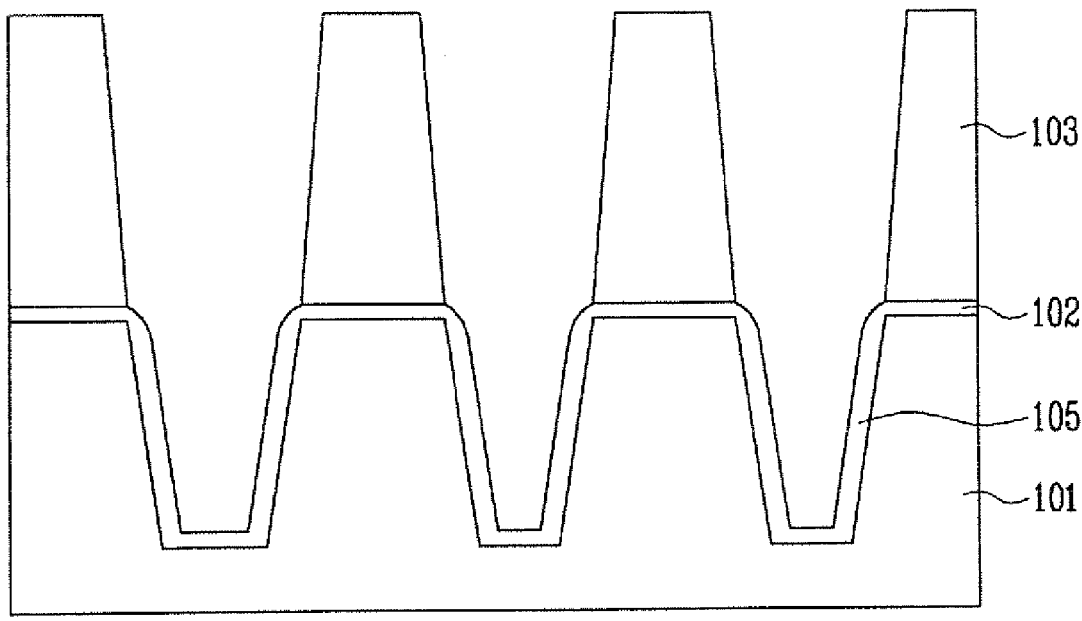

Thereafter, a native oxide film formed in the semiconductor substrate 101 and abnormal films created upon etching are removed by means of a pre-treatment cleaning process. Sidewall oxide films 105 are formed in the semiconductor substrate 101 in which the trenches 104 are formed by means of an oxidization process, as shown in FIG. 1c.

As an active critical dimension (CD) becomes small, the screen oxide film 102 is regrown upon formation of the sidewall oxide films 105. The sidewall oxide films 105 are formed with a sufficient target so that a final thickness of the screen oxide film 102, which initially has a thickness thinner than 50 Å, becomes 100 to 150 Å. For example, the sidewall oxide films 105 can be formed to a thickness of 50 to 300 Å.

As such, if the sidewall oxide films 105 are formed thickly, there is an advantage in that a thinning phenomenon in which an oxide film is not properly grown at top corners of trenches can be prohibited.

Thereafter, a thickness of the sidewall oxide films 105 is reduced by means of a pre-treatment cleaning process so that a subsequent gap-fill process of the trenches 104 is facilitated, whereby space sufficient for gap-filling is secured.

Figure 1D:
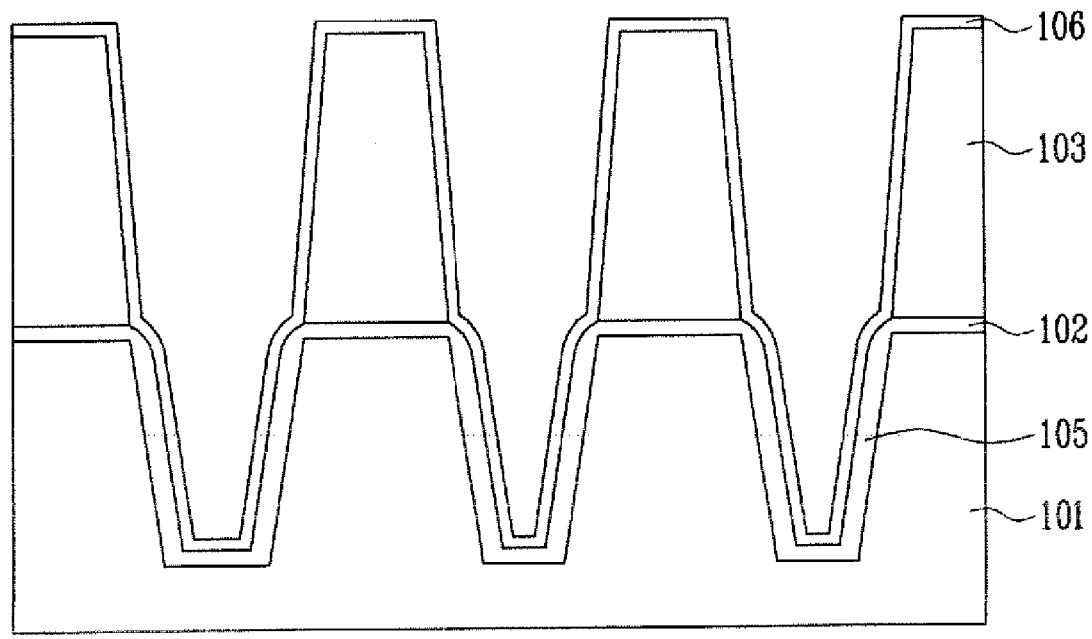

In order to prohibit additional regrown of the sidewall oxide films 105 and the screen oxide film 102 when a subsequent annealing process of $O_3$ tetra ethyl ortho silicate (TEOS) of wet oxidization mode is performed and also to prevent carbon-based impurities contained in $O_3$ TEOS from diffusing into the inner walls of the trenches 104, a liner nitride film 106 is formed on the entire surface of the semiconductor substrate 101, including the trenches 104, as shown in FIG. 1d.

The liner nitride film 106 is preferably formed to a thickness of 50 to 100 Å.

Figure 1E:
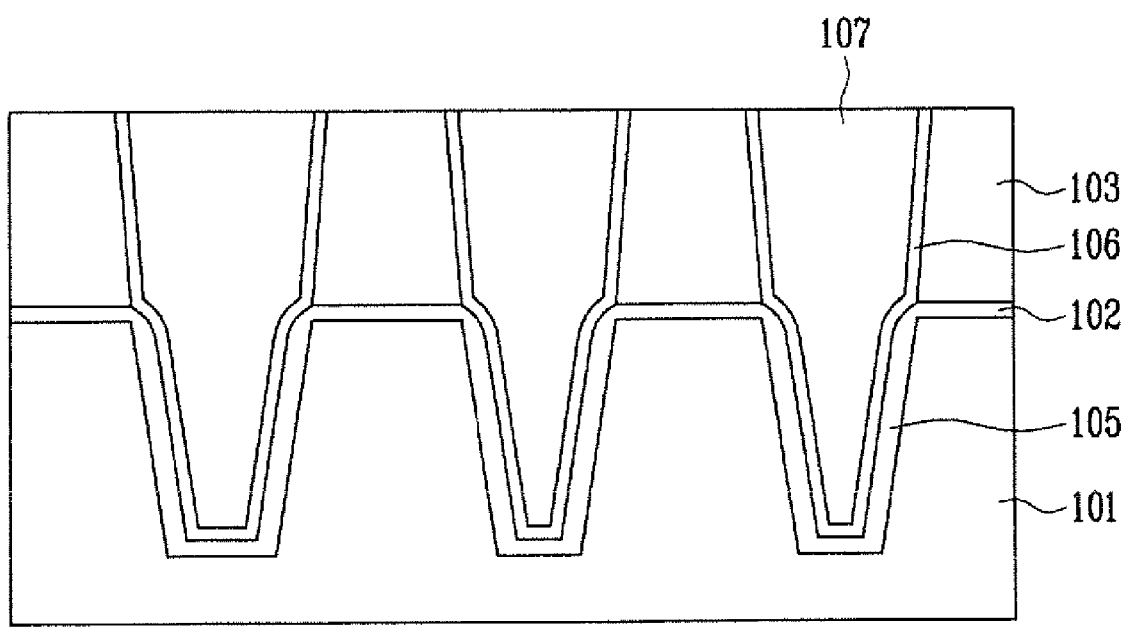

Referring next to FIG. 1e, the trenches 104 are gap-filled using $O_3$ TEOS so that efficient burial is possible in a narrow space.

In this case, $O_3$ TEOS for gap-filling the trenches 104 can be formed using $O_3$ and TEOS as source gases at a temperature of 500 to 550 Å and a pressure of 350 to 650 torr.

Thereafter, in order to strip seam and void formed upon gap-filling of $O_3$ TEOS, a steam anneal or wet anneal process of wet oxidization mode is performed.

In the annealing process of the wet oxidization mode, annealing is performed at a temperature ranging from 700 to 1000° C. with the flow rate of $H_2:O_2$ being set to 1:1 or 3:2. Additional annealing is then performed using only $N_2$ gas at a temperature ranging from 900 to 1000 Å.

Thereafter, $O_3$ TEOS undergoes CMP using the pad nitride film 103 as a stop barrier, thereby forming element isolation films 107 within the trenches 104.

In order to remove an oxide film that may remain on the pad nitride film 103, a post cleaning process using buffered oxide etchant (BOE) or HF is then implemented. In this case, the post cleaning process is controlled in such a way to ensure that the height of the element isolation films 107 is not excessively reduced.

Figure 1F:
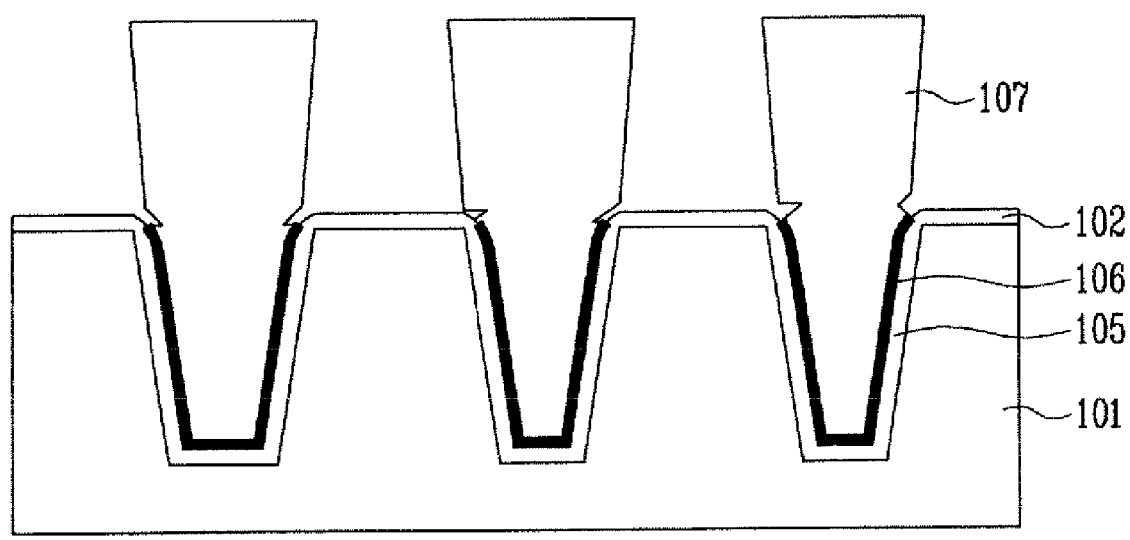

Referring to FIG. 1f, the pad nitride film 103 and the liner nitride film 106 at both sides thereof are removed. In this case, some of the liner nitride film 106 between the sidewall oxide films 105 and the element isolation films 107 is also etched.

The pad nitride film 103 and the liner nitride film 106 are removed using a phosphoric acid ($H_3PO_4$) solution.

As a result of removing the pad nitride film 103, portions of the element isolation films 107, which are projected upwardly from the surface of the semiconductor substrate 101, are exposed.

Figure 1G:
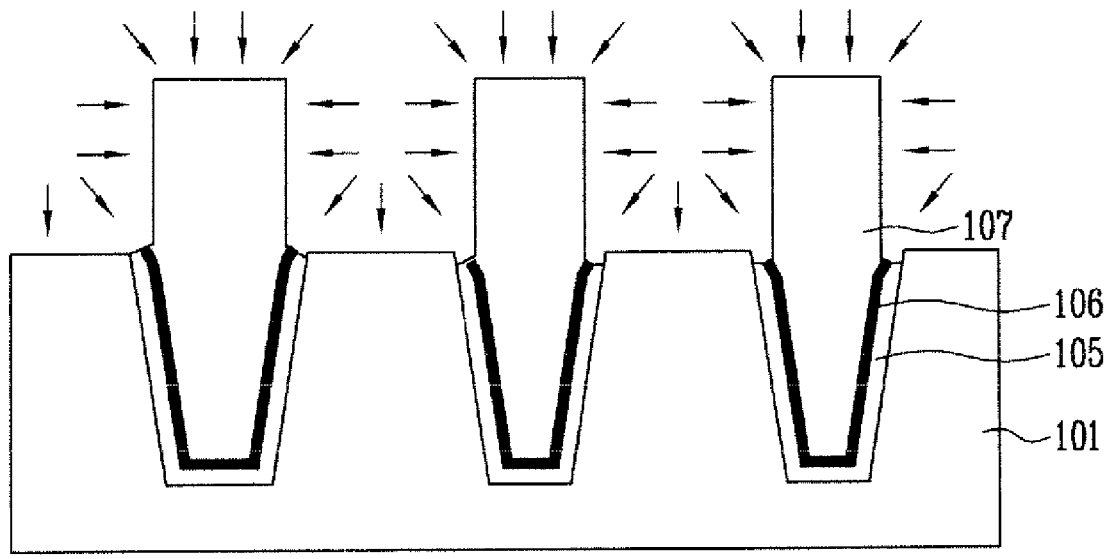

Referring to FIG. 1g, an etching using a diluted HF (DHF) solution or BOE is performed so that the screen oxide film 102 is removed.

In this case, the portions of the element isolation films 107, which are projected upwardly from the semiconductor substrate 101, are also etched, and the width thereof is reduced.

Furthermore, if the amount of the regrown screen oxide film 102 is irregular or too small, the liner nitride film 106 located between the element isolation films 107 and the semiconductor substrate 101 and the top portions of the sidewall oxide films 105 are removed a lot, thereby forming a moat. It is thus important to control the regrowth thickness of the screen oxide film 102 in the process of regrowing the screen oxide film 102.

Pre-treatment cleaning of wet dip-out mode is then performed so that the amount of the sidewall oxide films 105, which remains on the sidewalls of the trenches, is proper.

If a great amount of the sidewall oxide films 105 remains on the sidewalls of the trenches, a thinning phenomenon in which the edge portions of the tunnel oxide films 108 become thin occurs. To the contrary, if too much of the sidewall oxide films 105 are removed, polysilicon is buried or a void is created in the removed portions of the sidewall oxide films 105 in a subsequent polysilicon deposition process. Therefore, the removed amount of the sidewall oxide films 105 is controlled by controlling the wet dip-out time in the pre-treatment process.

Figure 1H:
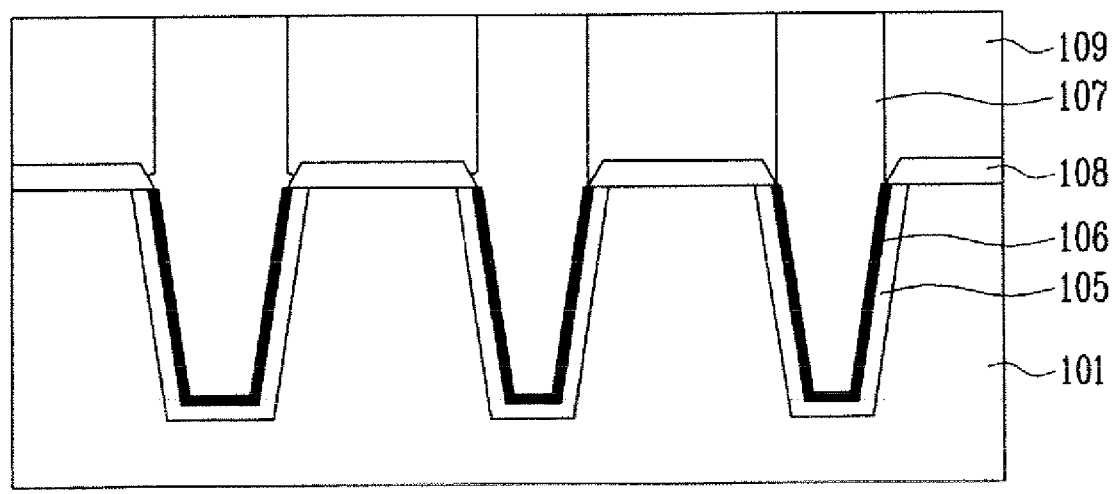

Referring next to FIG. 1*h*, tunnel oxide films 108 are formed on the surfaces of the semiconductor substrate 101, which are exposed through removal of the screen oxide film 102. Polysilicon (poly-si) is then deposited, where the poly-si is used as a floating gate.

Next, polysilicon experiences CMP so that the element isolation films 107 are exposed, thus forming floating gates 109 which are separated with the element isolation films 107 therebetween.

Figure 1I:
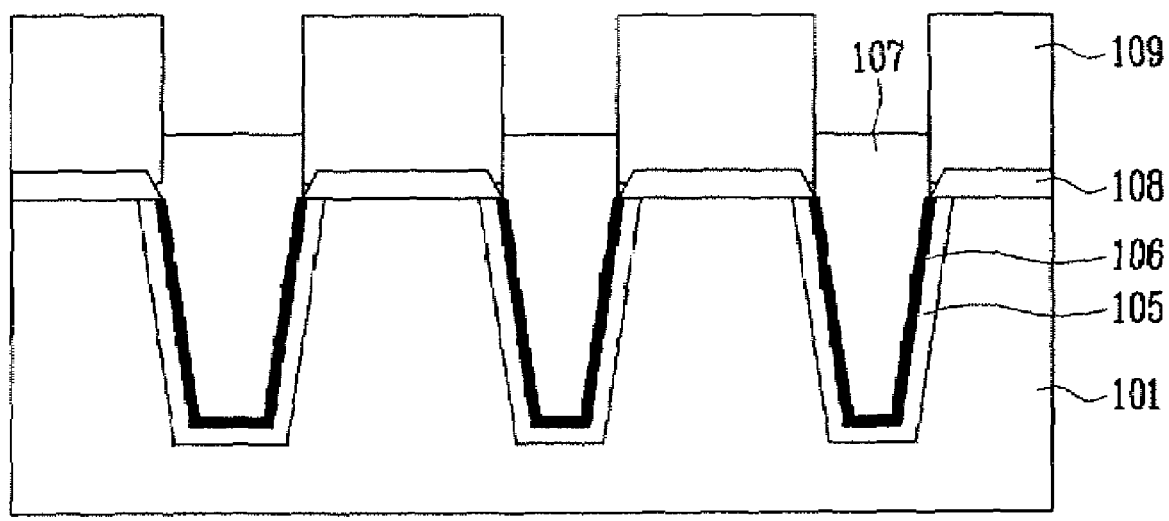

Referring to FIG. 1*i*, the element isolation films 107 between the floating gates 109 are removed to a desired amount by means of a pre-treatment cleaning process using HF or BOE thereby exposing the lateral portions of the floating gates 109. In this case, if the exposed lateral portions of the floating gates 109 are small because a small amount of the element isolation films 107 is removed, there is a problem in that the program speed becomes slow because the coupling ratio is low. To the contrary, if up to the tunnel oxide films 108 are etched because the element isolation films 107 are removed too much, there is a high possibility that malfunction may occur due to interference between a control gate to be formed later and an active region.

In view of the above, it is preferred that the element isolation films 107 are removed immediately on the tunnel oxide films 108.

Thereafter, although not shown in the drawings, a dielectric film is formed on the floating gates 109 and the element isolation films 107. A polysilicon film to be used as the control gate, and a silicide film are then formed. An anti-reflection coating film is formed thereon. Next, the anti-reflection coating film, the silicide film, the polysilicon film and the dielectric film are patterned by means of a gate patterning process. The floating gates 109 are then patterned by means of a self-aligned etch process using the patterned anti-reflection coating film.

Fabrication of the flash memory device is thereby completed.

When sidewall oxide films are formed, the width of an element isolation film, which is recessed simultaneously with the removal of a screen oxide film, can be controlled by controlling the regrowth thickness of the screen oxide film. It is thus possible to secure a stabilized floating gate space.

Secondly, the trench space can be secured by etching some of sidewall oxide films by means of a liner nitride film pre-treatment cleaning process. Gap-filling of the element isolation film can be facilitated.

Thirdly, when annealing of the wet oxidization mode for improving characteristics of an $O_3$ TEOS film using a liner nitride film is performed, additional oxidization of sidewall oxide films and regrowth of a screen oxide film can be prohibited.

Fourthly, an element isolation film, which is projected upwardly from the surface of a semiconductor substrate, is etched using a regrown thickness of a screen oxide film as a target. It is therefore possible to secure a sufficiently narrow space between floating gates within a range in which a moat is not formed.

Although the foregoing description has been made with reference to the various embodiments, it is to be understood that changes and modifications of the present invention may be made by the ordinary skilled in the art without departing from the spirit and scope of the present invention and appended claims.

What is claimed as new and desired to be protected by Letters Patent of the United States is:

1. A method of fabricating a flash memory device, comprising the steps of:
    forming a screen oxide film and a pad nitride film on a semiconductor substrate;
    etching the pad nitride film, the screen oxide film and the semiconductor substrate to form trenches;
    forming sidewall oxide films on the surface of the semiconductor substrate in which the trenches are formed, and regrowing the screen oxide film in such a way to have a predetermined thickness;
    reducing a thickness of the sidewall oxide films;
    forming a liner nitride film on the entire surface including the trenches;
    forming element isolation films within the trenches;
    removing the liner nitride film and the pad nitride film to expose the element isolation films that are projected upwardly from the semiconductor substrate;
    etching the entire surface so that the screen oxide film is removed, thereby reducing the width of the element isolation films, which are exposed due to the removal of the pad nitride film; and
    forming floating gates with tunnel dielectric films being interspersed between neighboring element isolation films.

2. The method as claimed in claim 1, wherein the screen oxide film is formed to a thickness of 20 to 50 Å.

3. The method as claimed in claim 1, further including the step of implanting a well ion and a threshold voltage ion after the screen oxide film is formed.

4. The method as claimed in claim 1, wherein a thickness of the regrown screen oxide film is 100 to 1 50 Å.

5. The method as claimed in claim 1, wherein the sidewall oxide films are formed to a thickness of 50 to 300 Å.

6. The method as claimed in claim 1, wherein the liner nitride film is formed to a thickness of 50 to 1 00 Å.

7. The method as claimed in claim 1, wherein the element isolation films are formed by performing the steps of:
    forming an insulating film on the entire surface including the trenches so that the trenches are buried;
    performing an annealing process for removing a seam and a void formed in the insulating film; and
    removing the insulating film by means of a chemical mechanical polishing process so that the insulating film remains only within the trenches.

8. The method as claimed in claim 7, wherein the insulating film is formed using $O_3$ TEOS.

9. The method as claimed in claim 8, wherein the $O_3$ TEOS film is formed using $O_3$ and TEOS sources at a temperature of 500 to 550 Å and a pressure of 350 to 650 torr.

10. The method as claimed in claim 7, wherein the annealing process is an annealing process of wet oxidization mode.

11. The method as claimed in claim 10, wherein the annealing process of the wet oxidization mode is one of a steam annealing process and a wet oxidization process.

12. The method as claimed in claim 10, wherein the annealing process of the wet oxidization mode includes the steps of:
    performing a first annealing process under a mixed gas atmosphere of $H_2$ and $O_2$; and performing a second annealing process under an atmosphere including only $N_2$ gas.

13. The method as claimed in claim 12, wherein in the first annealing process, the flow rate of $H_2:O_2$ is 1:1 or 3:2.

14. The method as claimed in claim 12, wherein a temperature of the first annealing process is 700 to 1000 Å.

15. The method as claimed in claim 12, wherein a temperature of the second annealing process is 900 to 1000 Å.

16. The method as claimed in claim 1, further including the step of performing a post cleaning process for removing an oxide film remaining on the pad nitride film, after the element isolation film is formed.

17. The method as claimed in claim 16, wherein in the post cleaning process, BOE or HF is used as a cleaning solution.

18. The method as claimed in claim 1, wherein the liner nitride film and the pad nitride film are etched using a phosphoric acid ($H_3PO_4$) solution.

19. The method as claimed in claim 1, wherein when the screen oxide film is etched, and DHF or BOE is used as an etch solution.

20. The method as claimed in claim 1, further including the step of removing the element isolation films existing between the floating gates by a predetermined thickness, thus exposing lateral portions of the floating gates after the floating gates are formed.

21. The method as claimed in claim 20, wherein the element isolation films are removed up to the tunnel dielectric film at a lower side of the floating gates.

22. The method as claimed in claim 1, further including the steps of:

after the floating gates are formed, sequentially forming an interlayer dielectric film, a control gate and an anti-reflection coating film on the entire surface; and patterning the anti-reflection coating film, the control gate and the interlayer dielectric film by means of a gate patterning process, and patterning the floating gates by means of a self-aligned etch process using the patterned anti-reflection coating film.

* * * * *

UNITED STATES PATENT AND TRADEMARK OFFICE
CERTIFICATE OF CORRECTION

| | | |
|---|---|---|
| PATENT NO. | : 7,125,769 B2 | Page 1 of 1 |
| APPLICATION NO. | : 11/160091 | |
| DATED | : October 24, 2006 | |
| INVENTOR(S) | : Cha Deok Dong | |

It is certified that error appears in the above-identified patent and that said Letters Patent is hereby corrected as shown below:

On the Title Page:

Item (57), line 1, "devices" should be -- device --.

In the Claims:

Column 6, line 37, "1 50" should be -- 150 --.

Column 6, line 40, "1 00" should be -- 100 --.

Signed and Sealed this

Seventeenth Day of April, 2007

JON W. DUDAS
*Director of the United States Patent and Trademark Office*